United States Patent
De La Llera et al.

(10) Patent No.: US 7,854,820 B2
(45) Date of Patent: Dec. 21, 2010

(54) UPPER ELECTRODE BACKING MEMBER WITH PARTICLE REDUCING FEATURES

(75) Inventors: Anthony De La Llera, Fremont, CA (US); Allan K. Ronne, Santa Clara, CA (US); Jaehyun Kim, Fremont, CA (US); Jason Augustino, Fremont, CA (US); Rajinder Dhindsa, San Jose, CA (US); Yen-Kun Wang, Union City, CA (US); Saurabh J. Ullal, South San Francisco, CA (US); Anthony J. Norell, Newark, CA (US); Keith Comendant, Fremont, CA (US); William M. Denty, Jr., San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 257 days.

(21) Appl. No.: 11/639,264

(22) Filed: Dec. 15, 2006

(65) Prior Publication Data

US 2008/0090417 A1    Apr. 17, 2008

Related U.S. Application Data

(60) Provisional application No. 60/851,745, filed on Oct. 16, 2006.

(51) Int. Cl.
   *H01L 21/306* (2006.01)
   *C23C 16/00* (2006.01)
(52) U.S. Cl. .................................. 156/345.34; 118/715
(58) Field of Classification Search ................ 118/715; 156/345.33, 345.34
   See application file for complete search history.

(56) References Cited

U.S. PATENT DOCUMENTS

| | | | | |
|---|---|---|---|---|
| 4,391,034 A | * | 7/1983 | Stuby | 118/504 |
| 5,074,456 A | * | 12/1991 | Degner et al. | 228/121 |
| 5,569,356 A | | 10/1996 | Lenz et al. | |
| 5,766,498 A | | 6/1998 | Kojima et al. | |
| 6,073,577 A | * | 6/2000 | Lilleland et al. | 118/723 E |
| 6,194,322 B1 | | 2/2001 | Lilleland et al. | |
| 6,206,972 B1 | | 3/2001 | Dunham | |
| 6,415,736 B1 | * | 7/2002 | Hao et al. | 118/723 E |

(Continued)

FOREIGN PATENT DOCUMENTS

KR    2006-004505 A    1/2006

OTHER PUBLICATIONS

International Search Report and Written Opinion dated Mar. 20, 2008 for PCT/US2007/021989.

*Primary Examiner*—Ram N Kackar
*Assistant Examiner*—Satish Chandra
(74) *Attorney, Agent, or Firm*—Buchanan Ingersoll & Rooney PC

(57) ABSTRACT

Components of a plasma processing apparatus includes a backing member with gas passages attached to an upper electrode with gas passages. To compensate for the differences in coefficient of thermal expansion between the metallic backing member and upper electrode, the gas passages are positioned and sized such that they are misaligned at ambient temperature and substantially concentric at an elevated processing temperature. Non-uniform shear stresses can be generated in the elastomeric bonding material, due to the thermal expansion. Shear stresses can either be accommodated by applying an elastomeric bonding material of varying thickness or using a backing member comprising of multiple pieces.

7 Claims, 9 Drawing Sheets

U.S. PATENT DOCUMENTS

| | | |
|---|---|---|
| 6,451,157 B1 | 9/2002 | Hubacek |
| 6,468,925 B2 | 10/2002 | Campbell et al. |
| 6,528,751 B1 | 3/2003 | Hoffman et al. |
| 6,616,766 B2* | 9/2003 | Dunham ............... 118/715 |
| 6,770,214 B2 | 8/2004 | Outka et al. |
| 6,786,175 B2* | 9/2004 | Dhindsa et al. ......... 118/723 E |
| 6,818,096 B2 | 11/2004 | Barnes et al. |
| 6,841,943 B2* | 1/2005 | Vahedi et al. ......... 315/111.71 |
| 6,872,281 B1* | 3/2005 | Chen et al. ............ 156/345.43 |
| 6,890,861 B1 | 5/2005 | Bosch |
| 7,196,283 B2* | 3/2007 | Buchberger et al. .... 219/121.43 |
| 2004/0023047 A1* | 2/2004 | O'Donnell et al. ......... 428/472 |
| 2004/0052969 A1* | 3/2004 | Lee et al. .................. 427/535 |
| 2004/0082251 A1* | 4/2004 | Bach et al. .................. 445/60 |
| 2004/0084410 A1* | 5/2004 | Lenz ........................ 216/67 |
| 2004/0133160 A1* | 7/2004 | Dalton ..................... 604/117 |
| 2005/0045593 A1* | 3/2005 | Ren et al. ..................... 216/83 |
| 2005/0133160 A1 | 6/2005 | Kennedy et al. |
| 2005/0173569 A1* | 8/2005 | Noorbakhsh et al. ........ 239/690 |
| 2006/0051965 A1 | 3/2006 | Edelberg et al. |
| 2006/0054280 A1 | 3/2006 | Jang |
| 2006/0108069 A1 | 5/2006 | Gernert |
| 2006/0118042 A1 | 6/2006 | Horimizu |
| 2006/0157445 A1 | 7/2006 | Mochiki |
| 2006/0215338 A1 | 9/2006 | Yokouchi et al. |

* cited by examiner

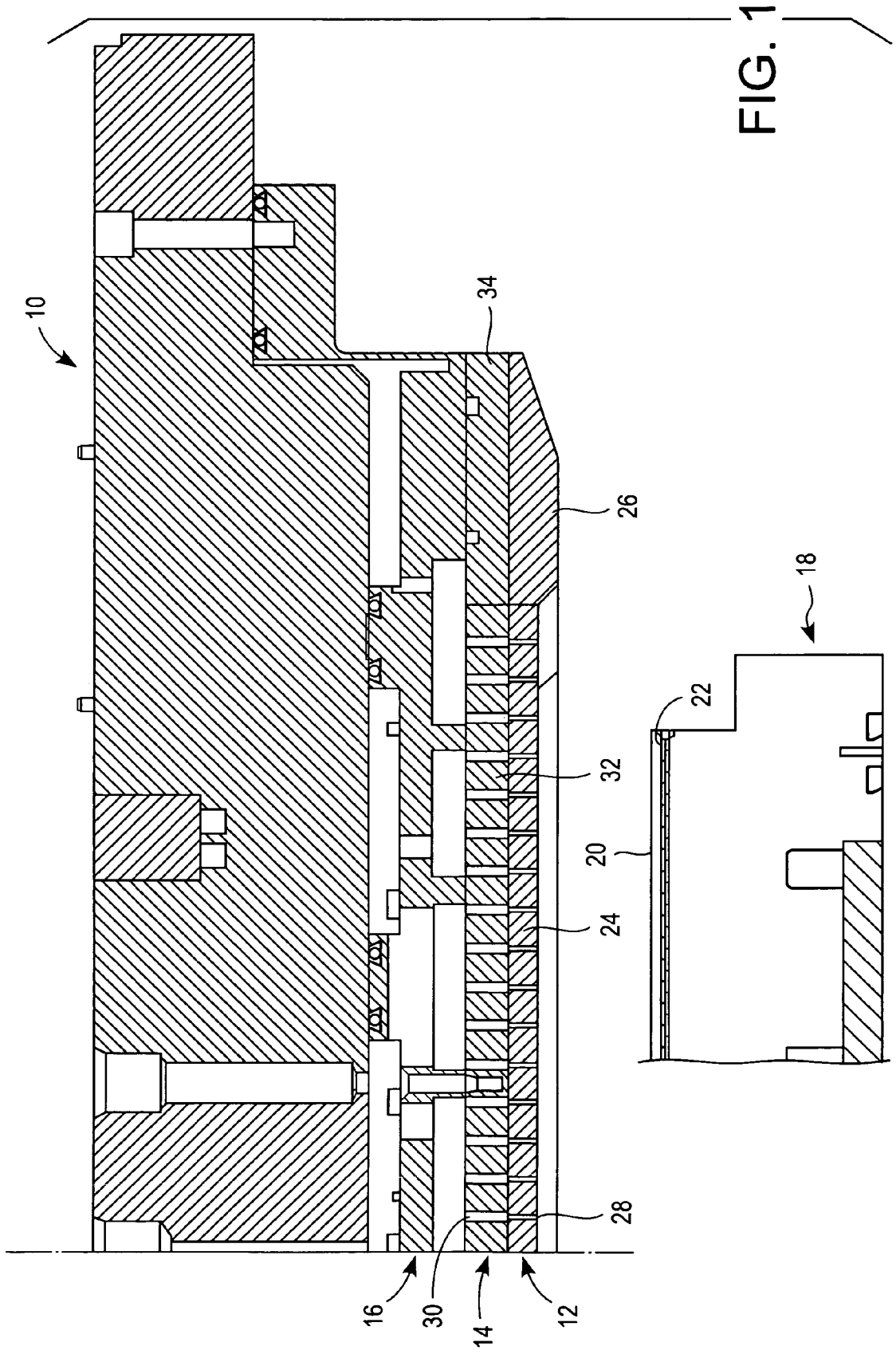

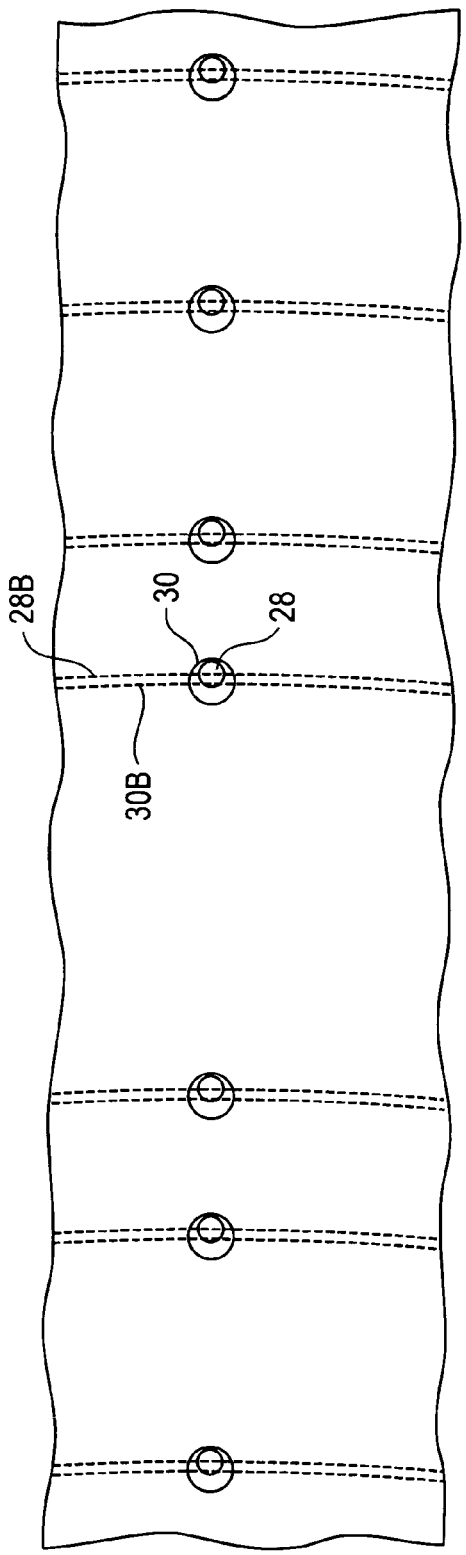
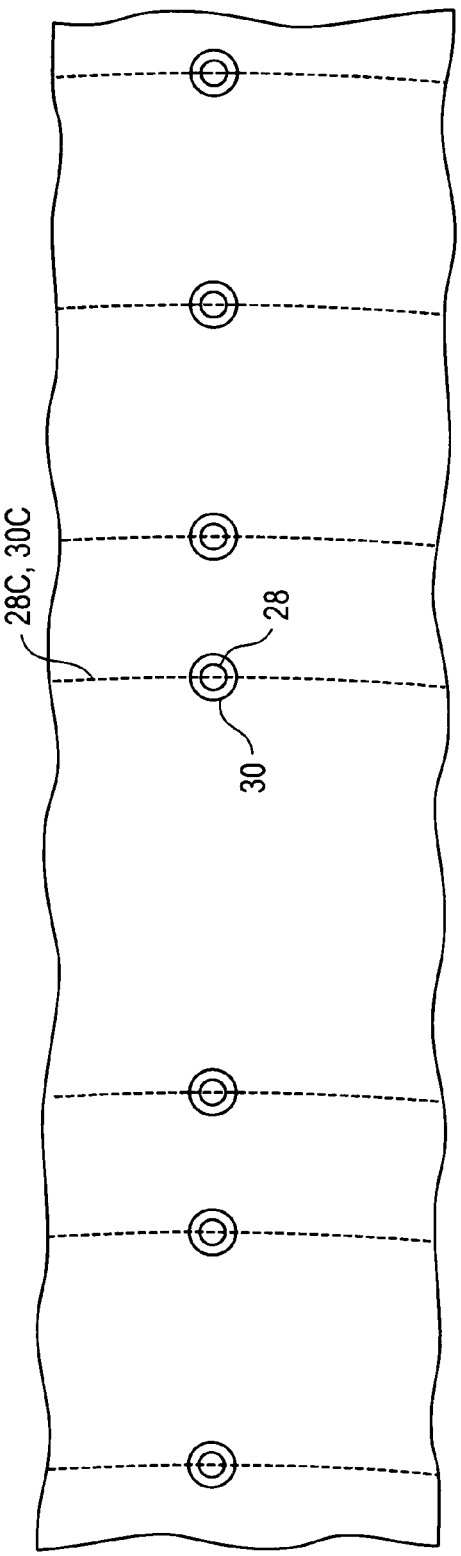
FIG. 2B
FIG. 2C

US 7,854,820 B2

UPPER ELECTRODE BACKING MEMBER WITH PARTICLE REDUCING FEATURES

RELATED APPLICATIONS

This application claims priority under 35 U.S.C. 119 to U.S. Provisional Application No. 60/851,745 entitled UPPER ELECTRODE BACKING MEMBER WITH PARTICLE REDUCING FEATURES and filed on Oct. 16, 2006, the entire content of which is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

A component for a plasma processing apparatus for processing semiconductor substrates is provided. In a preferred embodiment, the component includes a first member bonded to a second member. The first member includes a plurality of first through openings, a plasma-exposed surface and a first coefficient of thermal expansion. The second member attached to the first member includes a plurality of second through openings corresponding to the openings in the first member, the second member and having a second coefficient of thermal expansion greater than the first coefficient of thermal expansion. The first and second openings are misaligned at ambient temperature and the openings in the first member and the openings in the second member are substantially concentric when heated to an elevated processing temperature.

In a preferred embodiment, the component is a showerhead electrode assembly for a plasma processing apparatus.

A preferred embodiment of the showerhead electrode assembly for a plasma processing apparatus includes a silicon inner electrode with a plasma-exposed surface, the electrode having a plurality of axial gas distribution passages. A metallic backing member is bonded to the electrode and includes a plurality of axial gas distribution passages corresponding to the passages in the electrode. The passages in the backing member are radially larger than the passages in the electrode, to reduce the exposure of second member to a plasma environment. The passages in the electrode and the passages in the backing member are misaligned at ambient temperature and the passages in the electrode and the passages in the backing member are substantially concentric when heated to an elevated processing temperature.

Another preferred embodiment provides a method of processing a semiconductor substrate in a plasma processing apparatus. A substrate is placed on a substrate support in a reaction chamber of a plasma processing apparatus. A process gas is introduced into the reaction chamber with the showerhead electrode assembly. A plasma is generated from the process gas in the reaction chamber between the showerhead electrode assembly and the substrate. The substrate is processed with the plasma.

BRIEF DESCRIPTION OF THE FIGURES

FIG. 1 illustrates a portion of an embodiment of a showerhead electrode assembly and a substrate support for a plasma processing apparatus.

FIG. 2B is an enlarged plan view of FIG. 2A, including gas passages at an ambient temperature.

FIG. 2C is an enlarged plan view of FIG. 2A, including gas passages at an elevated processing temperature.

DETAILED DESCRIPTION

Figure 2A:
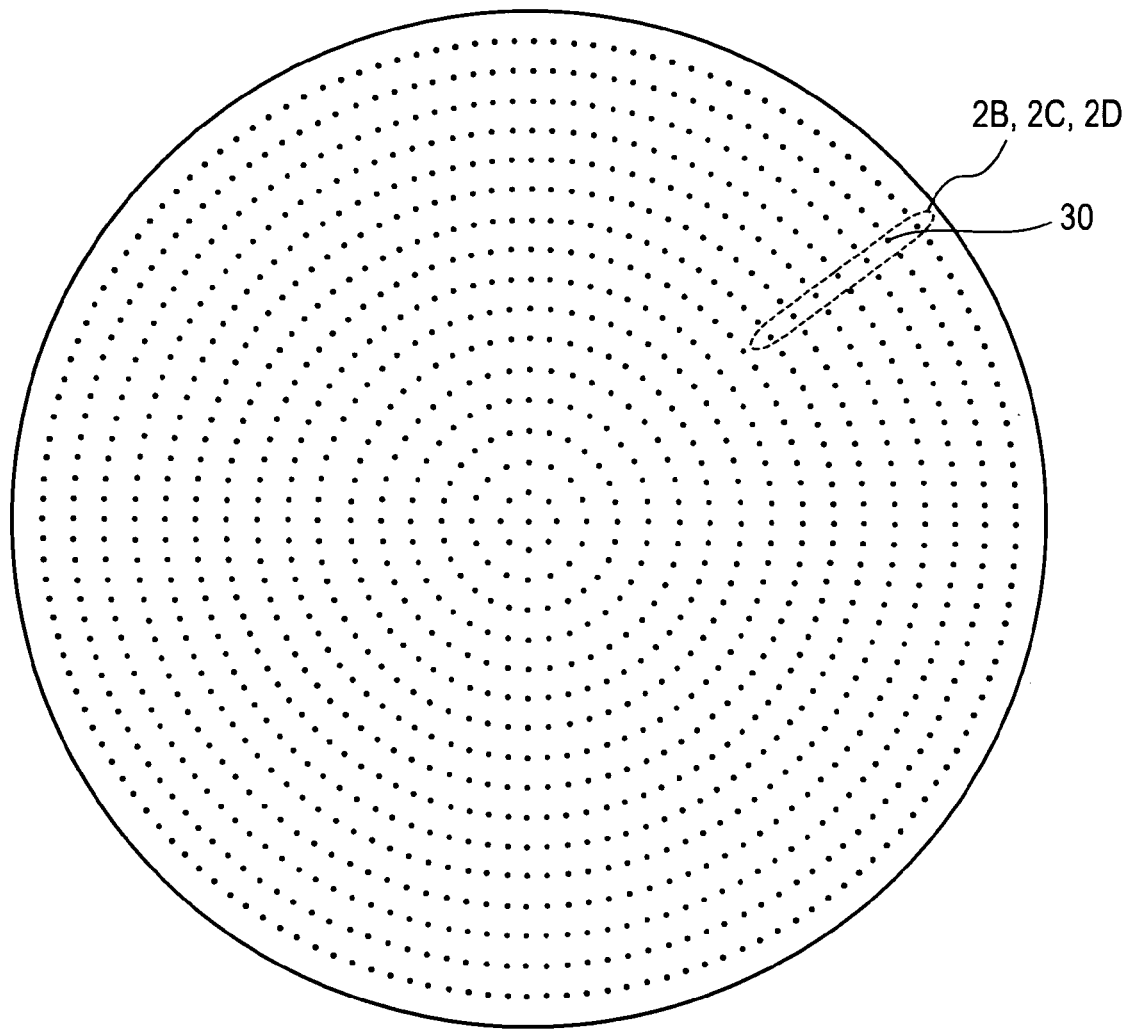
FIG. 2A illustrates a plan view of a circular backing member.

Control of particulate contamination on the surfaces of semiconductor wafers during the fabrication of integrated circuits is essential in achieving reliable devices and obtaining a high yield. Processing equipment, such as plasma processing apparatuses, can be a source of particulate contamination. For example, the presence of particles on the wafer surface can locally disrupt pattern transfer during photolithography and etching steps. As a result, these particles can introduce defects into critical features, including gate structures, intermetal dielectric layers or metallic interconnect lines, resulting in the malfunction or failure of the integrated circuit component.

FIG. 1 illustrates an embodiment of a showerhead electrode assembly 10 for a plasma processing apparatus in which semiconductor substrates, e.g., silicon wafers, are processed. The showerhead electrode assembly is also described, for example, in commonly-owned U.S. Patent Application Publication No. 2005/0133160, which is incorporated herein by reference in its entirety. The showerhead electrode assembly 10 comprises a showerhead electrode including an upper electrode 12, a backing member 14 secured to a thermal control plate 16. A substrate support 18 (only a portion of which is shown in FIG. 1) including a bottom electrode and optional electrostatic clamping electrode is positioned beneath the upper electrode in the vacuum processing chamber of the plasma processing apparatus. A substrate 20, subjected to plasma processing, is mechanically or electrostatically clamped on an upper support surface 22 of the substrate support 18.

The upper electrode 12 can be electrically grounded, or alternatively can be powered, preferably by a radio-frequency (RF) current source. In a preferred embodiment, the upper electrode 12 is grounded, and power at one or more frequencies is applied to the bottom electrode to generate plasma in the plasma processing chamber. For example, the bottom electrode can be powered at frequencies of 2 MHz and 27 MHz by two independently controlled radio frequency power sources. After a substrate 20 has been processed (e.g., a semiconductor substrate has been plasma etched), the supply of power to the bottom electrode is shut off to terminate plasma generation.

In the illustrated embodiment, the upper electrode 12 of the showerhead electrode includes an inner electrode member 24, and an optional outer electrode member 26. The inner electrode member 24 is preferably a cylindrical plate (e.g., a plate composed of silicon). The inner electrode member 24 can have a diameter smaller than, equal to, or larger than a wafer to be processed, e.g., a diameter up to 12 inches (300 mm) if the plate is made of single crystal silicon. In a preferred embodiment, the showerhead electrode assembly 10 is large enough for processing large substrates, such as semiconductor wafers having a diameter of 300 mm or larger. For 300 mm wafers, the upper electrode 12 is at least 300 mm in diameter. However, the showerhead electrode assembly 10 can be sized to process other wafer sizes or substrates having a non-circular configuration. In the illustrated embodiment, the inner electrode member 24 is wider than the substrate 20. For processing 300 mm wafers, the outer electrode member 26 is provided to expand the diameter of the upper electrode 12 from, for example, about 15 inches to about 17 inches. The outer electrode member 26 can be a continuous member (e.g., a continuous poly-silicon ring), or a segmented member (e.g., including 2-6 separate segments arranged in a ring configuration, such as multiple segments composed of silicon). In embodiments of the upper electrode 12 that include a multiple-segment, outer electrode member 26, the segments preferably have edges, which overlap each other to protect an underlying bonding material from exposure to plasma. The inner electrode member 24 preferably includes multiple gas passages 28 extending through and in correspondence with multiple gas passages 30 formed in the backing member 14 for injecting process gas into a space in a plasma reaction chamber located between the upper electrode 12 and the substrate support 18.

Silicon is a preferred material for plasma exposed surfaces of the inner electrode member 24 and the outer electrode member 26. High-purity, single crystal silicon minimizes contamination of substrates during plasma processing, and also wears smoothly during plasma processing, thereby minimizing particles. Alternative materials that can be used for plasma-exposed surfaces of the upper electrode 12 include SiC or AlN, for example.

In the illustrated embodiment, the backing member 14 includes a backing plate 32 and a backing ring 34 extending around the periphery of backing plate 32. In the embodiment, the inner electrode member 24 is co-extensive with the backing plate 32, and the outer electrode member 26 is co-extensive with the surrounding backing ring 34. However, in another embodiment, the backing plate 32 can extend beyond the inner electrode member 24 such that a single backing plate can be used to support the inner electrode member 24 and the segmented outer electrode member 26. The inner electrode member 24 and the outer electrode member 26 are preferably attached to the backing member 14 by a bonding material.

The backing plate 32 and backing ring 34 are preferably made of a material that is chemically compatible with process gases used for processing semiconductor substrates in the plasma processing chamber, and is electrically and thermally conductive. Exemplary suitable materials that can be used to make the backing member 14 include aluminum, aluminum alloys, graphite, and SiC.

The upper electrode 12 can be attached to the backing plate 32 and the optional backing ring 34 with a suitable thermally and electrically conductive elastomeric bonding material that accommodates thermal stresses, and transfers heat and electrical energy between the upper electrode 12 and the backing plate 32 and backing ring 34. The use of elastomers for bonding together surfaces of an electrode assembly is described, for example, in commonly-owned U.S. Pat. No. 6,073,577, which is incorporated herein by reference in its entirety.

In one embodiment, backing member 14 can be composed of graphite, which has a slightly higher coefficient of thermal expansion to silicon, a material for the upper electrode 12. The grade of graphite for backing member 14 has a coefficient of thermal expansion of $4.5 \times 10^{-6}$ $(°\text{F.})^{-1}$; silicon has a coefficient of thermal expansion of $1.4 \times 10^{-6}$ $(°\text{F.})^{-1}$. As a result, the bonding material used to attach the graphite backing member 14 to the silicon upper electrode 12 is subjected to lower stresses during thermal cycling of the assembly. However, for certain situations, a graphite backing member 14 can be less than completely satisfactory in some embodiments of the showerhead electrode assembly 10, because graphite can be an source of particulate contamination, lowering the overall yield of the manufacturing process.

One approach for minimizing the introduction of particulate matter is to replace graphite with a metallic material (e.g., aluminum, stainless steel, copper, molybdenum, or alloys thereof), which provide improved stability under extreme operating conditions and generates fewer particles. Metallic components are more cost effective and easier to machine, in comparison to their non-metallic counterparts. However, in replacing a graphite backing member 14 with aluminum, for example, additional problems need to be overcome, including: (i) compensating for the difference in coefficient of thermal expansion in the aluminum backing member 14 and silicon upper electrode 12; and (ii) interactions between certain process gases and the aluminum.

Fluorine-containing gas (e.g., $CF_4$, $CHF_3$) plasmas can be used in plasma process chambers for etching dielectrics or organic materials. The plasma is composed of partially ionized fluorine gas, including ions, electrons, and other neutral species, such as radicals. However, aluminum chamber hardware, when exposed to low-pressure, high-power, fluorine-containing gas plasma, can produce a significant amount of aluminum fluoride (i.e., $AlF_x$) byproduct. A process that minimizes aluminum fluoride particles from the chamber hardware would reduce the incidence of defects, chamber processing drift, and/or chamber downtime for cleaning and maintenance.

Due to the thermal expansion of the backing member 14 and upper electrode 12, gas passages 28 and 30 move radially relative to each other and shift positions during heating. For example, the radial movement of gas passage 28 relative to the center of the circular upper electrode 12 due to thermal expansion varies depending upon the radial distance of a particular gas passage 28 from the center of the upper electrode 12. In other words, upon heating of the upper electrode 12, a gas passage near the outer periphery of the upper electrode 12 normally moves a greater distance relative to the center of the upper electrode 12 than a gas passage located near the center. If the backing member 14 and upper electrode 12 are constructed of materials with similar coefficients of thermal expansion (e.g., a graphite backing member 14 bonded to a silicon upper electrode 12), gas passages 28 and 30, which are concentric at room temperature, remain substantially concentric at an elevated process temperature. However, when forming the backing member 14 and upper electrode 12 of materials with different coefficients of thermal expansion, additional complexities occur. For example, aluminum has a coefficient of thermal expansion of $14 \times 10^{-6}$ $(°\text{ F.})^{-1}$; silicon has a much smaller coefficient of thermal expansion of $1.4 \times 10^{-6} (°\text{ F.})^{-1}$. This large difference in coefficient of thermal expansion may pose additional problems, including misalignment of gas passages 28 and 30 and accommodating shear stresses that are generated at the bonded interface when the upper electrode 12 is heated to elevated temperatures.

FIG. 2A illustrates a circular backing member 14, including gas passages 30. FIG. 2B is an enlarged view of multiple gas passages 28 and 30 (as indicated in FIG. 2A) which are circular through holes at an ambient temperature. For this embodiment, the backing member 14 is aluminum and upper electrode 12 is silicon. The dashed arcs 28B, 30B in FIG. 2B represent concentric circles passing through the center of gas passages 28, 30, respectively, indicating the radial position of each gas passage. In this particular embodiment, gas passages 28, 30 are misaligned (i.e., the center of each pair of through hole 28, 30 is non-concentric or offset) at ambient temperature. For a circular backing member 14 and a circular upper electrode 12, the degree of misalignment increases in the radial direction from the center of the backing member 14 and upper electrode 12 to the periphery of these components. However, gas passages 28, 30 are positioned, sized or shaped, such that when the backing member 14 and upper electrode 12 are heated to a specified elevated process temperature (e.g., between about 80° C. and about 160° C.), gas passages 28, 30 are substantially concentric, as illustrated in FIG. 2C. In other words, upon heating, the dashed arcs 28B, 30B in FIG. 2B expand radially by different amounts, such that they overlap, as seen in FIG. 2C. In this embodiment, although gas passages 28 and 30 are misaligned at ambient temperature, the diameter of the through hole in the aluminum backing member 14 is sufficiently large, such that gas passages 28 and 30 always overlap between ambient temperature and at elevated temperatures, as seen in FIG. 2.

Figure 2D:
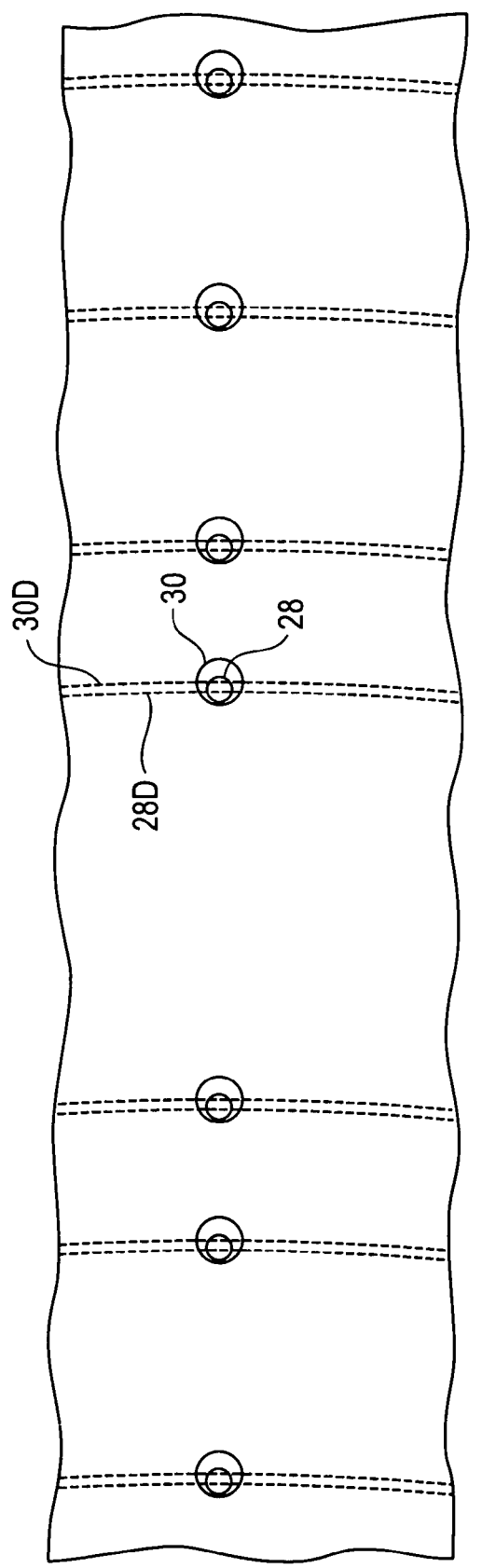
FIG. 2D is an enlarged plan view of FIG. 2A, including gas passages at a maximum processing temperature.

Upon heating to a maximum process temperature, the gas passages 28, 30 become misaligned, as indicated by the radial position of each gas passage as indicated by the dashed arcs 28D, 30D in FIG. 2D.

Figure 3:
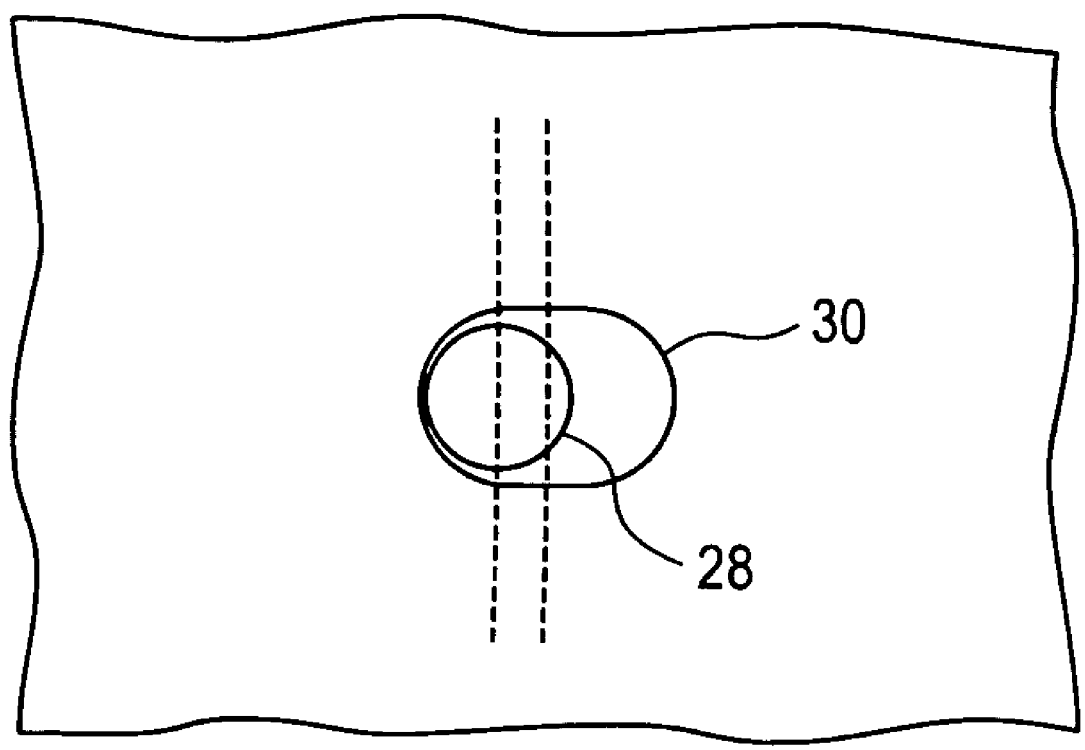
FIG. 3 is an enlarged plan view of FIG. 2A, depicting a non-circular gas passage.

In alternate embodiments, the through holes 28, 30 can be non-circular or the like, such as a semi-elliptical or radially elongated, as seen in FIG. 3.

As illustrated in FIGS. 2B and 2C, the gas passage 30 in the aluminum backing member 14 is larger than the gas passage 28 in the silicon upper electrode 12. The size of the gas passage 30 is effective to prevent the formation of a plasma within gas passage 30. As described above, the exposure of an aluminum component to fluorine-containing gas plasma can generate unwanted aluminum fluoride byproducts. This configuration can advantageously reduce the exposure of the aluminum backing member 14 to a fluorine ions and/or radicals. During plasma processing, fluorine ions or radicals may migrate through gas passages 28 and react with aluminum. Thus, a radially larger aluminum through hole configuration increases the diffusion length of an ion or radical, reducing the probability of interacting with the aluminum backing member 14. In other words, a radially larger aluminum through hole reduces the line of sight from ions or radicals in the plasma to an exposed aluminum surface. Thus, the larger aluminum through holes can reduce and preferably minimize the generation of aluminum fluoride particles in the plasma processing chamber.

Figure 4:
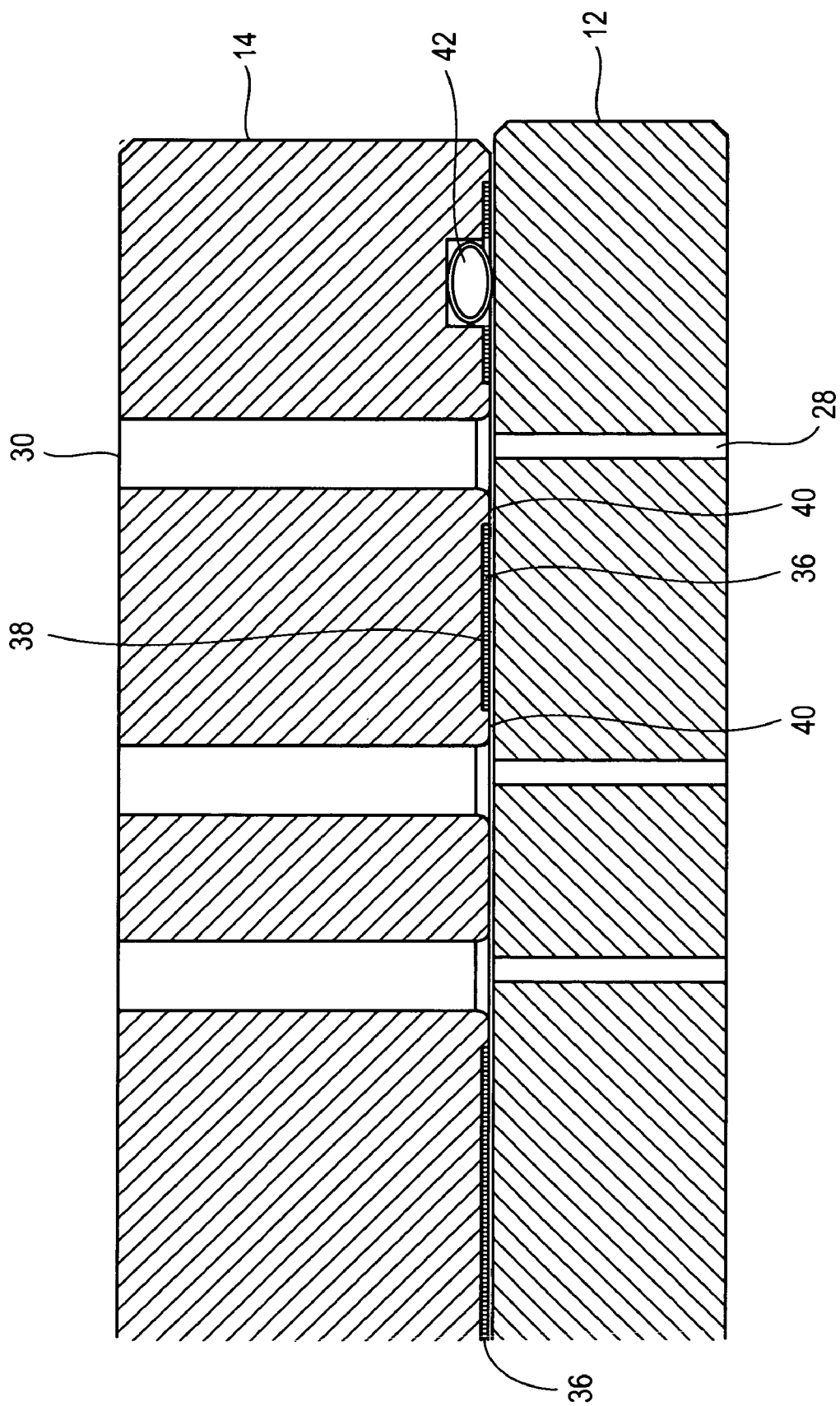
FIG. 4 is a cross-sectional view of the backing member attached to upper electrode, including an elastomeric bonding material and conductive member.

In a preferred embodiment of the upper electrode 12 and backing member 14, these two components are attached with an elastomeric bonding material 36 as illustrated in FIG. 4. In this embodiment, the backing member 14 and upper electrode 12 are configured to minimize plasma attack of the elastomeric bonding material 36. As shown in FIG. 4, an elastomeric bonding material 36 is applied in the interior of annular recesses 38 that extend into the surface of backing member 14 with the depth of the recess defined by walls 40. Alternatively, the recesses 38 may be located in the upper electrode 12. The outmost walls 40 of the recess 38 can protect the elastomeric bonding material 36 from attack by the plasma environment in the plasma processing reactor. In the embodiment illustrated in FIG. 4, an electrically conductive member 42 is in direct contact with the backing member 14 and upper electrode 12. The conductive member 42 is mounted near the peripheral edge of the backing member 14 and upper electrode 12 to improve RF conduction. Additionally, the conductive member 42 improves DC conduction between the backing member 14 and upper electrode 12, preventing arcing between these two components. Preferably, the conductive member 42 is flexible, such that the member can accommodate the contraction and expansion due to thermal cycling of the electrode assembly. For example, the flexible conductive member 42 can be a spiral metallic gasket (e.g., RF gasket), preferably made of stainless steel or the like.

Figure 5:
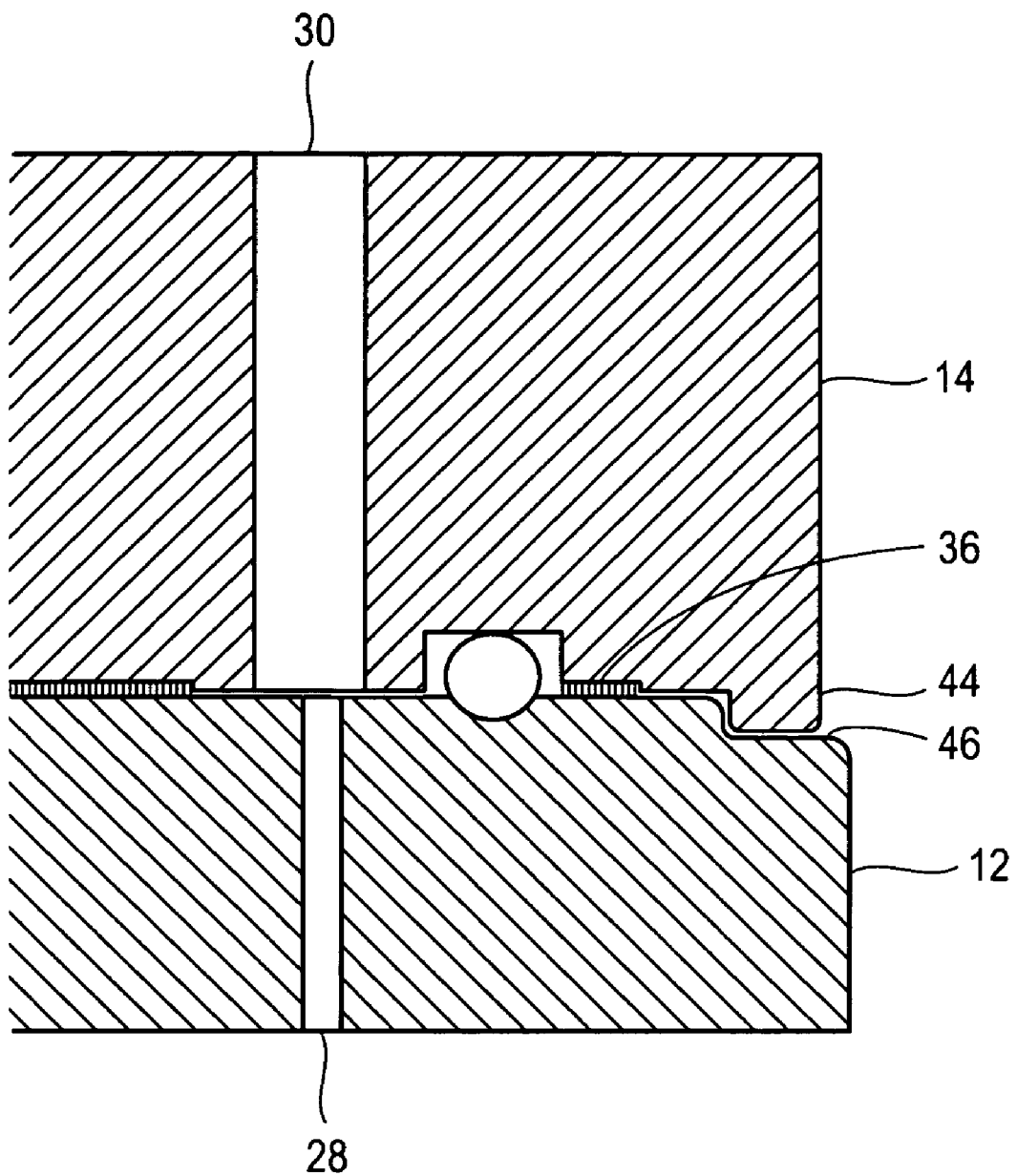
FIG. 5 is a cross-sectional view of the backing member attached to upper electrode, including a raised peripheral edge to reduce the exposure of the elastomeric bonding material to a plasma environment.

In another embodiment of the upper electrode 12 and backing member 14, as illustrated in FIG. 5, the backing member 14 comprises a peripheral annular flange 44, and the upper electrode 12 comprises a peripheral annular recess 46 configured to mate with the peripheral annular flange 44. This flange 44 reduces exposure of the elastomeric bonding material 36 to a plasma environment by shielding the elastomeric bonding material 36 from the ions or radicals in the plasma. Additionally, to increase the amount of contact area between the bonding material and the backing member 14 and upper electrode 12, bonding surfaces can be roughened or textured prior to applying the elastomeric bonding material 36.

As described above, when a component, such as the backing member 14 or upper electrode 12, is heated to an elevated processing temperature, the outer portion expands to a greater degree than the central portion. If two components with similar coefficients of thermal expansion are bonded (e.g., a graphite backing member 14 and a silicon upper electrode 12), upon heating, the shear stress applied to the elastomeric bonding material is limited, because both materials undergo a similar amount of thermal expansion. However, if two components with greater differences in thermal expansion coefficients are bonded (i.e., aluminum and silicon), upon heating, a non-uniform shear stress is generated in the elastomeric bonding material 36, due to the different rates of thermal expansion. For example, if a circular aluminum backing member 14 is concentrically bonded to a circular silicon upper electrode 12, the shear stress in the elastomeric bonding material 36 near the center of backing member 14 and upper electrode 12 is minimal at an elevated processing temperature. However, the outer portion of the aluminum backing member 14 undergoes a larger amount of thermal expansion than the outer portion of the silicon upper electrode 12. As a result, when the two materials are bonded, the maximum shear stress occurs in the outer peripheral edge of the backing member 14 or upper electrode 12, where the difference in thermal expansion is greatest.

Figure 6:
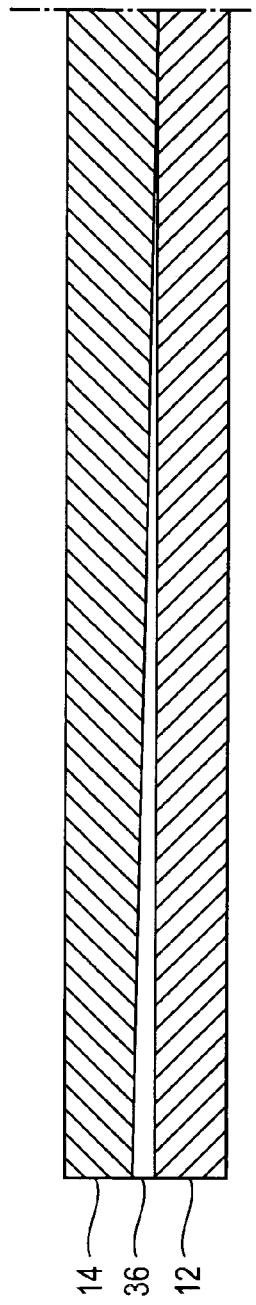
FIG. 6 is a cross-sectional view of backing member and upper electrode, including an elastomeric bonding material having a non-uniform thickness.

FIG. 6 illustrates a cross-sectional view of a circular backing member 14 bonded to a circular upper electrode 12 with a variable elastomeric bonding material 36 thickness (gas passages 28, 30 are not shown). As shown, the thickness of the elastomeric bonding material 36 is varied, such that the non-uniform thickness is effective to accommodate non-uniform shear stresses generated by thermal expansion. In the embodiment shown in FIG. 6, the elastomeric bonding material 36 is thinnest near the center of the backing member 14 and upper electrode 12, where the shear stress is minimal due to thermal expansion. In contrast, the elastomeric bonding material 36 is thickest near the outer peripheral edge of backing member 14 and upper electrode 12.

In general, components with smaller dimensions (i.e., less volume) undergo a smaller amount of thermal expansion. For example, a circular aluminum member with a 12 inch diameter expands radially approximately 0.027 inches when heated from ambient to 200° C.; a circular aluminum member with a 2 inch diameter expands radially approximately 0.0045 inches when heated from ambient to 200° C. Thus, it has been determined that by bonding a smaller aluminum member 14 to a silicon upper electrode 12, the elastomeric bonding material 36 needs to accommodate significantly less shear stress. In other words, instead of bonding the upper electrode 12 to a larger, single aluminum backing member 14 having a continuous surface, the upper electrode 12 can be bonded to multiple smaller pieces of aluminum (i.e., each having a surface area less than the surface area of the electrode it is bonded to), which in which each individual piece undergoes a smaller amount of thermal expansion. As a result, the elastomeric bonding material 36 is subjected to a smaller degree of shear stress with respect to each individual piece during thermal expansion.

Figure 7B:
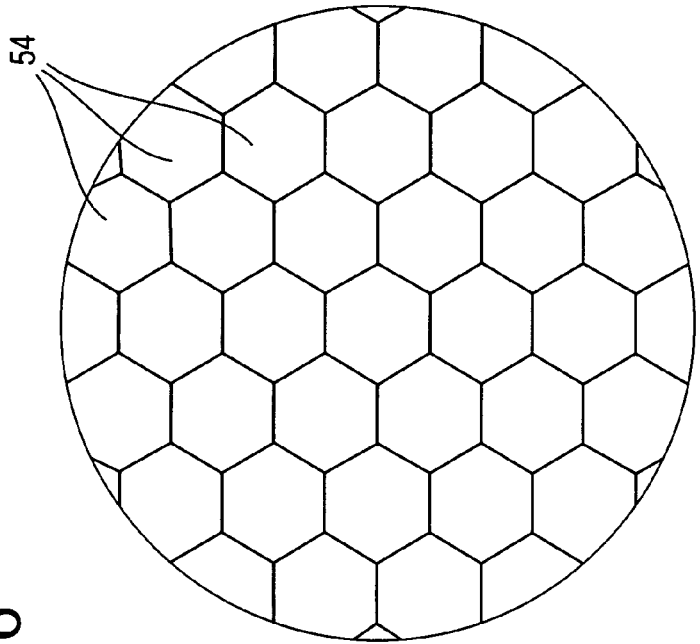
FIG. 7B illustrates a plan view of the backing member, comprising multiple pieces having hexagonal-shapes.
Figure 7A:
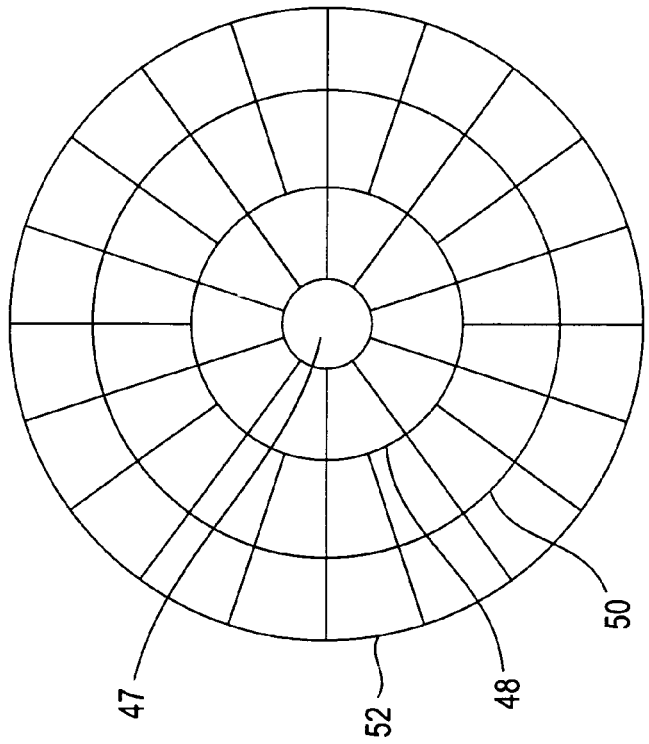
FIG. 7A illustrates a plan view of the backing member, comprising multiple pieces forming a segmented concentric ring.

FIGS. 7A and 7B illustrate two embodiments of the backing member 14 each of which comprises of multiple pieces (gas passages not shown). For example, the backing member 14 is comprised of a circular plate 47 with multiple concentric annular rings, inner ring 48, middle ring 50, and outer ring 52. as shown in FIG. 7A. Each concentric ring 48, 50, 52 can either be continuous (not shown) or separate segments arranged in a ring configuration. In the embodiment shown in FIG. 7B, the backing member 14 is comprised of multiple hexagonal-shaped pieces 54 with outer pieces 54 shaped to complete the circular configuration of backing member 14.

Figure 8:
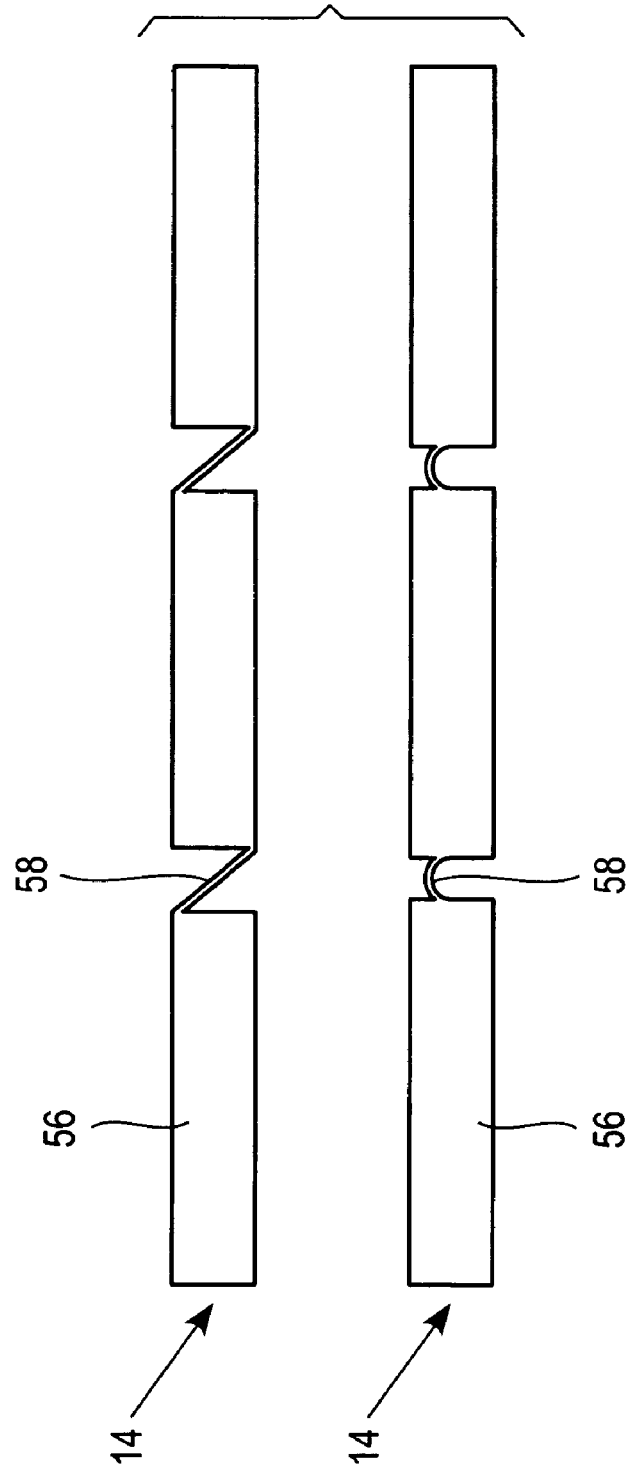
FIG. 8 illustrates a cross-sectional view of backing member, including thicker segments connected by thinner flexure segments.

In an alternative embodiment, illustrated in FIG. 8, the backing member 14 is a single piece with a non-uniform thickness across its width, to impart flexibility to the backing member 14 during thermal cycling (gas passages 28, 30 are not shown). Similar to the configuration with multiple pieces, the thicker segments 56 with the same thickness, of reduced dimensions are subjected to a smaller degree of thermal expansion. In this embodiment, the thicker segments 56 such as a circular plate and outer annular sections are connected together by thinner flexure segments 58, such as thin rectilinier or curved segments, which are configured to accommodate thermal expansion, thus reducing the shear stress applied to the elastomeric bonding material 36 during thermal expansion. In another embodiment, not shown in FIG. 8, concentric or helical grooves can formed in backing member 14 to provide areas to accommodate thermal expansion.

EXAMPLE 1

Tests were performed to determine the effect of the backing member 14 material on particle generation during semiconductor wafer processing in an EXELAN® FLEX™ dielectric plasma etch system, manufactured by Lam Research Corporation, located in Fremont, Calif. For these tests, the generation of particles over 0.09 μm for an aluminum backing member was compared with that from a graphite backing member for multiple silicon wafers. The tests were performed by placing a 300 mm silicon wafer in a plasma processing system, similar to the configuration in FIG. 1 and plasma processing the wafer with a process recipe similar to a semiconductor etching process. For multiple tests, the silicon wafer surface was then analyzed with a laser scanning device for the number of particles larger than 0.09 μm to obtain the number of particle adders (the difference between the number of particles on the wafer before the plasma process and after the plasma process). As seen in Table 1, the aluminum backing member generated fewer particle adders than the graphite backing member.

TABLE 1

| Backing Member Material | Particle Adders (>0.09 μm) (median) |
| --- | --- |
| Graphite | 25 |
| Aluminum | 9 |

While the invention has been described in detail with reference to specific embodiments thereof, it will be apparent to those skilled in the art that various changes and modifications can be made, and equivalents employed, without departing from the scope of the appended claims.

What is claimed is:

1. A component for a plasma processing apparatus for processing semiconductor substrates, the component comprising:

a first member having a plurality of first through openings, the first member having a plasma-exposed surface and a first coefficient of thermal expansion, the first openings located at different radial positions across the surface;

a second member bonded with an elastomeric bonding material to the first member and having a plurality of second through openings corresponding to the first openings, the second member having a second coefficient of thermal expansion greater than the first coefficient of thermal expansion;

wherein the second openings are larger than the first openings and centers of the first and second openings are misaligned at ambient temperature and the centers of the first and second openings move radially and are closer together due to thermal expansion when the first and second members are heated to a predetermined elevated processing temperature;

wherein: (a) the openings in the first member and the openings in the second member are substantially concentric when the first and second members are heated to the predetermined elevated processing temperature; (b) the second openings reduce the exposure of the second member to a plasma environment; (c) the second openings are non-circular; (d) the second openings are semi-elliptical holes or radially elongated slots; (e) the openings in the first and second members are axially extending gas distribution passages; (f) the second member is composed of a metal; (g) the second member is composed of aluminum, molybdenum, copper, stainless steel, or alloys thereof; or (h) the first member is composed of a non-metallic material.

2. The component of claim 1, wherein (a) the first member is silicon and (b) the second member is aluminum.

3. The component of claim 2, wherein the first member is a silicon plate and the second member is an aluminum plate: (a) the elastomeric bonding material is applied in one or more recesses formed in the first member, each recess having walls adapted to reduce the exposure of the elastomeric bonding material to a plasma environment; (b) the elastomeric bonding material is applied in one or more recesses formed in the second member, each recess having walls adapted to reduce the exposure of the elastomeric bonding material to a plasma environment; or (c) the second member comprises an axially extending peripheral flange and the first member comprises a peripheral recess configured to mate with the flange, which is adapted to reduce exposure of the elastomeric bonding material to a plasma environment in the apparatus.

4. The component of claim 3, further comprising an electrically conductive member mounted between and in direct contact with the first and second members.

5. The component of claim 4, wherein the conductive member is composed of an RF gasket material and mounted near a peripheral edge of the first and second members.

6. The component of claim 3, wherein: (a) the elastomeric bonding material has a variable thickness effective to compensate for a non-uniform shear stress generated in the elastomeric bonding material when heated to the predetermined elevated processing temperature during processing of semiconductor substrates or (b) the first member and second member are circular plates, concentrically bonded, and the thickness of the elastomeric bonding material is varied in a radial direction of the first and second members, the thickness effective to compensate for a non-uniform shear stress generated in the elastomeric bonding material when heated to an elevated processing temperature.

7. The component of claim 1, wherein the second member has a non-uniform thickness across its width, adapted to impart flexibility to the second member during thermal cycling.

* * * * *